United States Patent
Pickett et al.

(10) Patent No.: US 11,043,611 B2
(45) Date of Patent: Jun. 22, 2021

(54) QUANTUM DOT ARCHITECTURES FOR COLOR FILTER APPLICATIONS

(71) Applicant: NANOCO TECHNOLOGIES LTD., Manchester (GB)

(72) Inventors: Nigel L. Pickett, Manchester (GB); James Harris, Manchester (GB); Margaret Hines, Berkley, CA (US); Joseph Taylor, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 0 days.

(21) Appl. No.: 16/863,116

(22) Filed: Apr. 30, 2020

(65) Prior Publication Data

US 2020/0257169 A1    Aug. 13, 2020

Related U.S. Application Data

(62) Division of application No. 16/026,791, filed on Jul. 3, 2018, now Pat. No. 10,768,485.

(60) Provisional application No. 62/528,823, filed on Jul. 5, 2017.

(51) Int. Cl.

| | |
|---|---|
| H01L 33/26 | (2010.01) |
| B82Y 40/00 | (2011.01) |
| B82Y 20/00 | (2011.01) |
| G02F 1/13357 | (2006.01) |
| C09K 11/02 | (2006.01) |
| C09K 11/88 | (2006.01) |
| C09K 11/70 | (2006.01) |
| C01B 25/08 | (2006.01) |
| C09K 11/56 | (2006.01) |

(52) U.S. Cl.
CPC ............ *H01L 33/26* (2013.01); *C01B 25/087* (2013.01); *C09K 11/025* (2013.01); *C09K 11/565* (2013.01); *C09K 11/70* (2013.01); *C09K 11/703* (2013.01); *C09K 11/883* (2013.01); *G02F 1/133617* (2013.01); *B82Y 20/00* (2013.01); *B82Y 40/00* (2013.01); *G02F 2202/36* (2013.01)

(58) Field of Classification Search
CPC .......... G02F 1/133617; G02F 2202/36; C09K 11/70; C09K 11/565; C09K 11/025; C09K 11/883; C09K 11/703; C01B 25/087; B82Y 40/00; B82Y 20/00
See application file for complete search history.

(56) References Cited

U.S. PATENT DOCUMENTS

| | | | | |
|---|---|---|---|---|
| 2005/0248929 | A1* | 11/2005 | Kawamura | ......... H01L 51/5281 362/84 |
| 2006/0220509 | A1* | 10/2006 | Ghosh | ................. H01L 51/5268 313/110 |
| 2007/0273275 | A1* | 11/2007 | Jang | ....................... B82Y 20/00 313/504 |
| 2014/0022779 | A1* | 1/2014 | Su | ............................. F21V 9/38 362/231 |

(Continued)

*Primary Examiner* — Herve-Louis Y Assouman
(74) *Attorney, Agent, or Firm* — Blank Rome, LLP

(57) ABSTRACT

Organically capped quantum dots are made by functionalizing the surfaces of QDs of various architectures with a combination of 6-mercaptohexanol (MCH) and 2-[2-(2-methoxyethoxy)-ethoxy]-acetic acid (MEEAA). Such MCH/MEEAA-capped QDs exhibit improved compatibility with solvents used in the fabrication of QD-containing films of light emitting devices, such as liquid crystal displays.

20 Claims, 6 Drawing Sheets

(56) References Cited

U.S. PATENT DOCUMENTS

| | | | | |
|---|---|---|---|---|
| 2014/0161729 A1* | 6/2014 | Barany | ............... | G01N 33/573 |
| | | | | 424/9.6 |
| 2014/0264172 A1* | 9/2014 | Daniels | .................. | B01J 2/003 |
| | | | | 252/301.6 S |
| 2015/0021528 A1* | 1/2015 | Chartoff | .................. | C08K 9/04 |
| | | | | 252/582 |
| 2016/0004124 A1* | 1/2016 | Benoit | .............. | G02F 1/133603 |
| | | | | 349/69 |
| 2016/0233391 A1* | 8/2016 | Xu | ....................... | H01L 23/296 |

* cited by examiner

QUANTUM DOT ARCHITECTURES FOR COLOR FILTER APPLICATIONS

CROSS-REFERENCE TO RELATED APPLICATIONS

This application is a divisional of U.S. Non-Provisional application Ser. No. 16/026,791 filed Jul. 3, 2018, which claims the benefit of U.S. Provisional Application No. 62/528,823 filed Jul. 5, 2017, the entire contents of which are incorporated herein by reference.

FEDERALLY SPONSORED RESEARCH OR DEVELOPMENT

Not Applicable

BACKGROUND OF THE INVENTION

1. Field of the Invention

The present invention generally relates to electronic displays. More particularly, it relates to the use semiconductor nanoparticles ("quantum dots") in emissive color filters for liquid crystal displays (LCDs).

2. Description of the Related Art Including Information Disclosed Under 37 CFR 1.97 and 1.98

In order for a display technology to display a range of colors, it needs to be able to switch the output of multiple pixels or sub-pixels of different color such that the combination of the resulting color outputs adds to make the viewer perceive the composite color. For example, magenta can be produced by two adjacent pixels showing blue and red and the hue can be varied by tuning the relative intensities of the blue and red light components.

The method of modulating or switching the pixel intensities varies across differing display technologies as does the method of generating the red, green and blue primary color sub-pixels. In the case of liquid crystal displays (LCD) or White-OLED (WOLED) based displays, the display employs a white backlight which is filtered through red, green and blue color filters to produce the primary color light output.

An area of increasing interest is the use of quantum dots (QDs) in the emissive color filters of LCDs. To better understand this interest, it is necessary to briefly discuss how LCDs work. The way in which LCDs are able to switch or modulate light intensity relies on the use of a complex stack of optical films utilizing a liquid crystal cell between crossed polarizers. The backlight unit produces unpolarized white light which enters the liquid crystal cell through a linear polarizer. When a voltage is applied to the liquid crystal cell, this results in a change of alignment of the crystals and rotation of the linearly polarized white light which then passes through the color filter and the transmitted light (which now has the correct polarization) exits the display via a second linear polarizer arranged orthogonal to the first. When no voltage is being applied, the liquid crystals are not aligned in a way that rotates the incoming polarized light. After transmission through the color filter, the transmitted light is still of the original polarization and as such is blocked by the second linear polarizer and cannot exit the system.

Operation of LCDs crucially relies on controlling the polarization of light and, as such, scattering within the system should be minimized because any scattering may result in depolarization of the light, resulting in diminished contrast ratio. An example of this is when the pixel is off, the liquid crystal does not rotate the light so it should not be able to exit the system because of rejection by the second polarizer. However, if there has been some scattering and depolarization of the light, a portion of the depolarized light may be of the correct polarization to exit and thus lead to pixel bleed-through and lost contrast.

As mentioned briefly above, LCDs employ a white backlight which is filtered through red, green and blue color filters to produce the primary RGB pixel color light output. This method of producing RGB primaries is not the most efficient approach however, as in each case a lot of light is being filtered away. For example, to make the red primary, the green and blue portions of the backlight have to be filtered out, for green the red and blue portions need to be filtered out and so on.

The color performance of displays is usually discussed in terms of color gamut size relative to a standard. In particular, the amount of overlap of a respective standard is often the most relevant information.

The width of the transmission window is important inasmuch as it determines how much of the non-desired light can leak through and directly impacts the saturation of the RGB primaries and the resulting color performance of the display device. In order to decrease the amount of leakage, manufacturers increase the optical density of the color filter, making it less transmissive, which results in improved color at the expense of overall light transmission and display luminance.

BRIEF DESCRIPTION OF THE SEVERAL VIEWS OF THE DRAWING(S)

DETAILED DESCRIPTION OF THE INVENTION

Figure 1A:
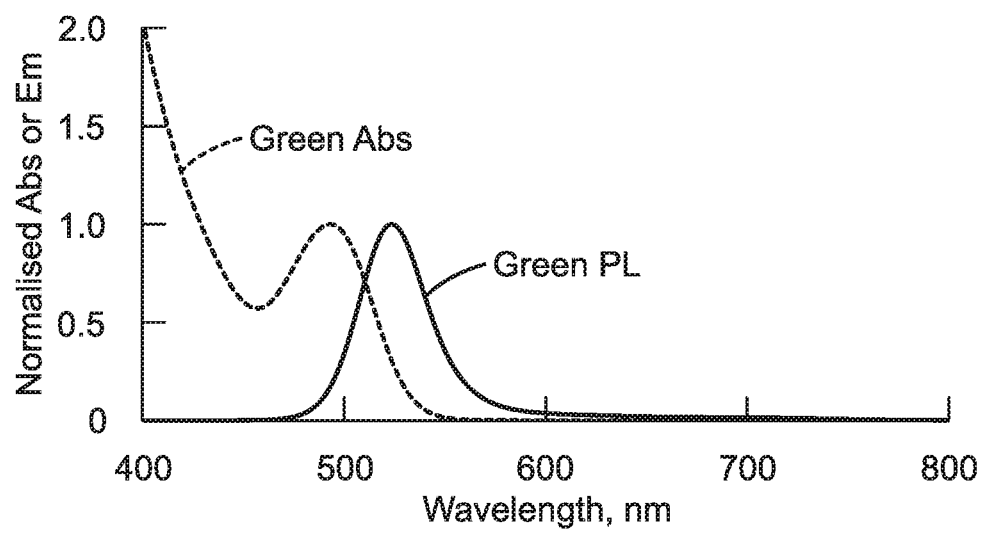
FIGS. 1A and 1B show UV/visible absorption and emission spectra for green-emitting (FIG. 1A) and red-emitting (FIG. 1B) CFQD quantum dots.

The following description of the embodiments is merely exemplary in nature and is in no way intended to limit the subject matter of the present disclosure, their application, or uses.

As used throughout, ranges are used as shorthand for describing each and every value that is within the range. Any value within the range can be selected as the terminus of the range. Unless otherwise specified, all percentages and amounts expressed herein and elsewhere in the specification should be understood to refer to percentages by weight.

For the purposes of this specification and appended claims, unless otherwise indicated, all numbers expressing quantities, percentages or proportions, and other numerical values used in the specification and claims, are to be understood as being modified in all instances by the term "about." The use of the term "about" applies to all numeric values, whether or not explicitly indicated. This term generally refers to a range of numbers that one of ordinary skill in the art would consider as a reasonable amount of deviation to the recited numeric values (i.e., having the equivalent function or result). For example, this term can be construed as including a deviation of ±10 percent, alternatively ±5 percent, alternatively ±1 percent, alternatively ±0.5 percent, and alternatively ±0.1 percent of the given numeric value provided such a deviation does not alter the end function or result of the value. Accordingly, unless indicated to the contrary, the numerical parameters set forth in this specification and attached claims are approximations that can vary depending upon the desired properties sought to be obtained by the present invention.

It is noted that, as used in this specification and the appended claims, the singular forms "a," "an," and "the," include plural references unless expressly and unequivocally limited to one referent. As used herein, the term "include" and its grammatical variants are intended to be non-limiting, such that recitation of items in a list is not to the exclusion of other like items that can be substituted or added to the listed items. For example, as used in this specification and the following claims, the terms "comprise" (as well as forms, derivatives, or variations thereof, such as "comprising" and "comprises"), "include" (as well as forms, derivatives, or variations thereof, such as "including" and "includes") and "has" (as well as forms, derivatives, or variations thereof, such as "having" and "have") are inclusive (i.e., open-ended) and do not exclude additional elements or steps. Accordingly, these terms are intended to not only cover the recited element(s) or step(s), but may also include other elements or steps not expressly recited. Furthermore, as used herein, the use of the terms "a" or "an" when used in conjunction with an element may mean "one," but it is also consistent with the meaning of "one or more," "at least one," and "one or more than one." Therefore, an element preceded by "a" or "an" does not, without more constraints, preclude the existence of additional identical elements.

QD as Luminescent Color Filter to Convert a Blue Backlight

Research has been carried out in the past with the goal of using QDs as luminescent color filters to convert a blue backlight. One of the drawbacks of this implementation is that, in order to make this work well, 100% of the incoming blue light must be absorbed and converted, at an acceptable level of efficiency, to provide the saturated color required. With less than 100% absorbance any non-absorbed blue light will be transmitted and lower the color purity of the green or red pixel and be detrimental to color performance.

CFQD® quantum dot materials [Nanoco Technologies Ltd., 46 Grafton Street, Manchester M13 9NT U.K.] have a strong overlap between the excitonic absorption and emission. As used herein "CFQD quantum dots" mean quantum dots of various diameters having a core comprising indium and phosphorus. In some instances, CFQD quantum dots can further include one or more shells at least partially covering the core. In some instances, at least one of the one or more shells includes zinc. In some instances, at least one of the one or more shells includes zinc and any one of sulfur, selenium and oxygen. In some instances, at least one of the one or more shells includes zinc and one or more of sulfur, selenium and oxygen. In some instances, CFQD quantum dots are broad wavelength absorbers and emitters of light having wavelengths in the red region visible spectrum. In some instances, CFQD quantum dots are broad wavelength absorbers and emitters of light having wavelengths in the green region visible spectrum. In some instances, CFQD quantum dots are broad wavelength absorbers and emitters of light having wavelengths in the yellow region visible spectrum. In some instances, CFQD quantum dots are broad wavelength absorbers and emitters of light having wavelengths in the orange region visible spectrum. In some instances, CFQD quantum dots are broad wavelength absorbers and emitters of light having wavelengths in the blue region visible spectrum.

Figure 1B:
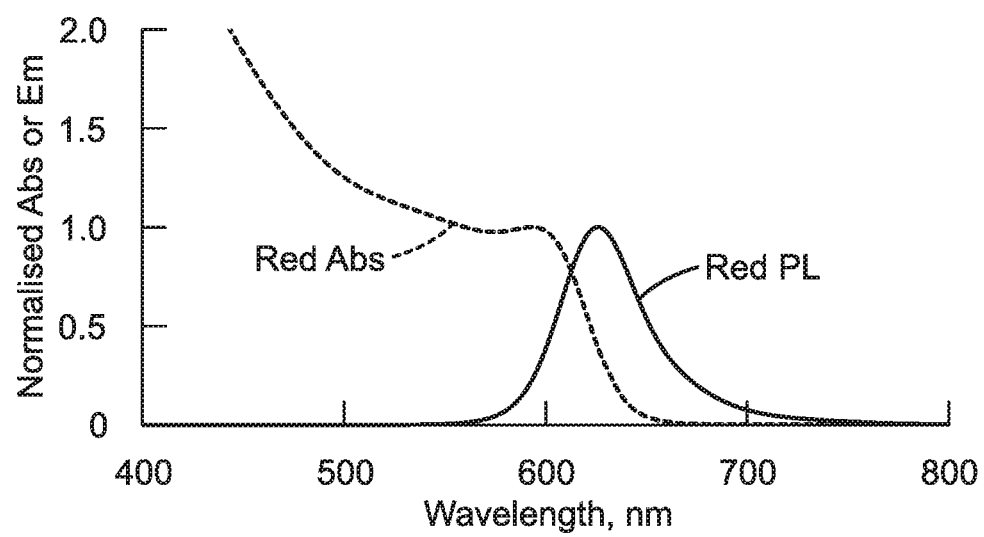
Figure 2A:
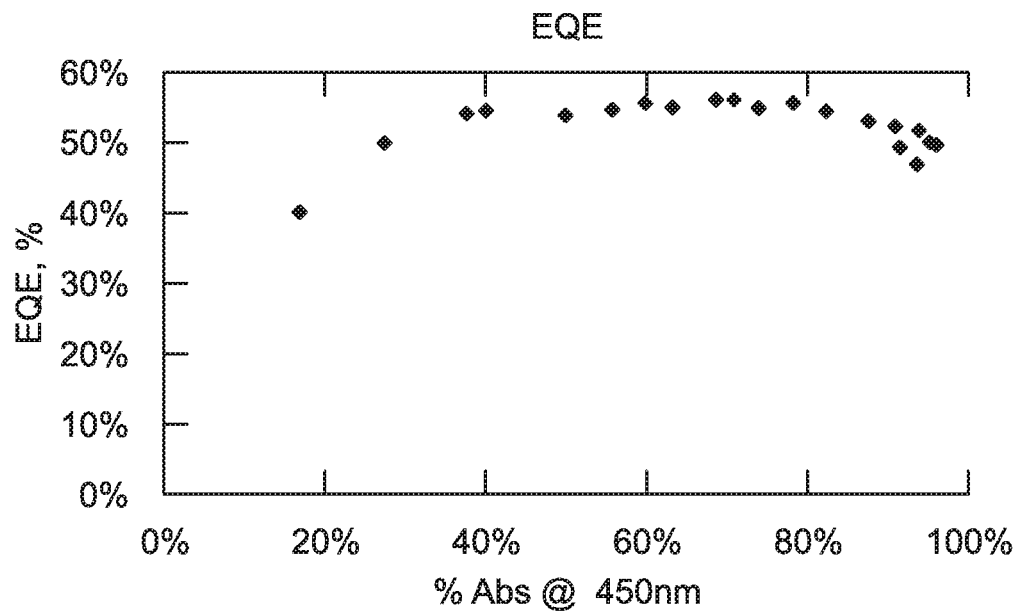
FIG. 2A is plot of EQE vs. % blue LED absorbance for green-emitting CFQD quantum dots.
Figure 2B:
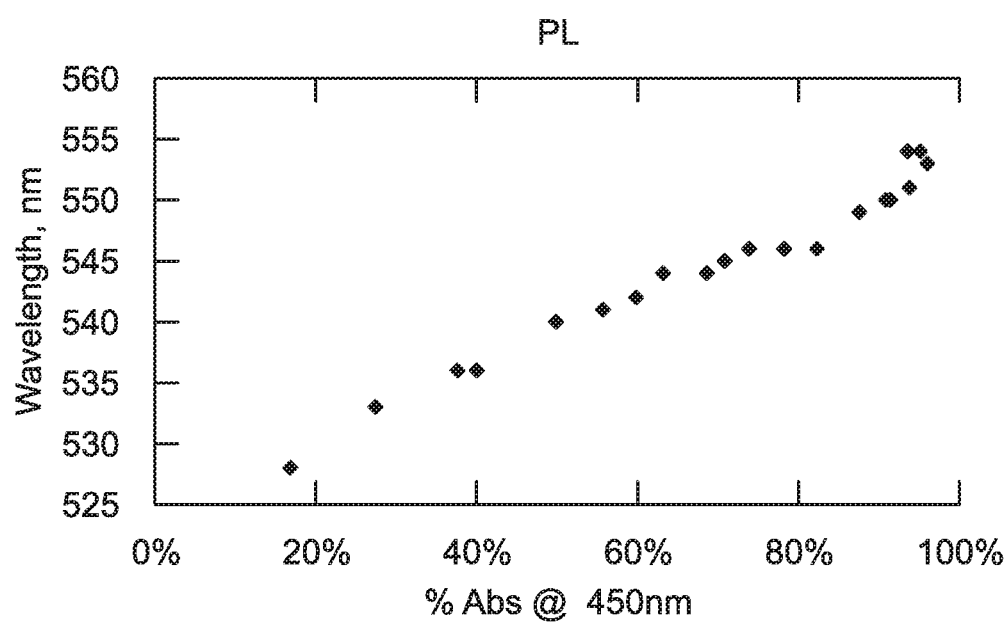
FIG. 2B is a plot of peak emission wavelength vs. % blue LED absorbance for green-emitting CFQD quantum dots.
Figure 2C:
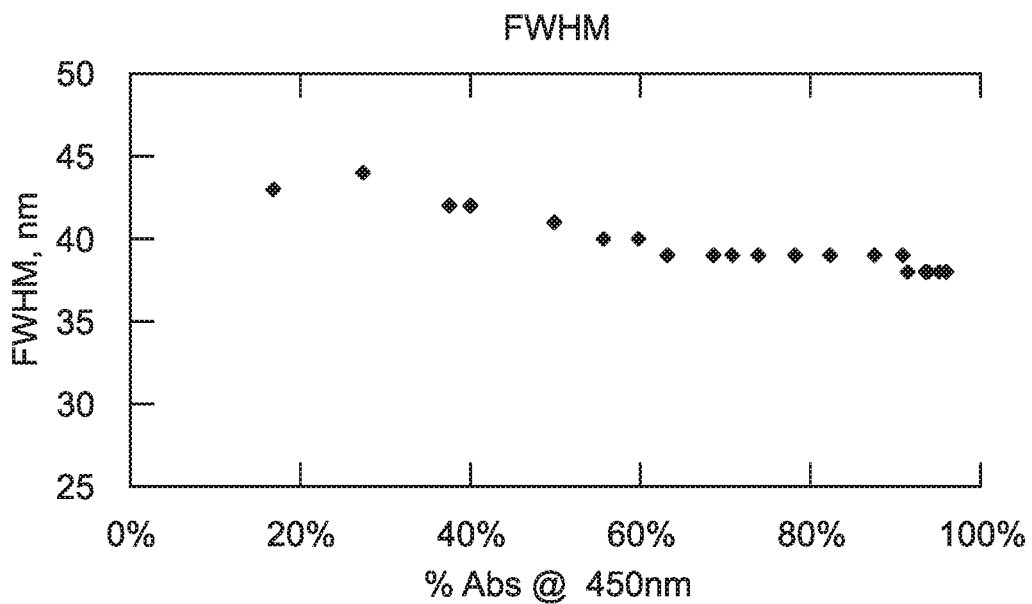
FIG. 2C is a plot of FWHM vs. % blue LED absorbance, for green-emitting CFQD quantum dots.
Figure 2D:
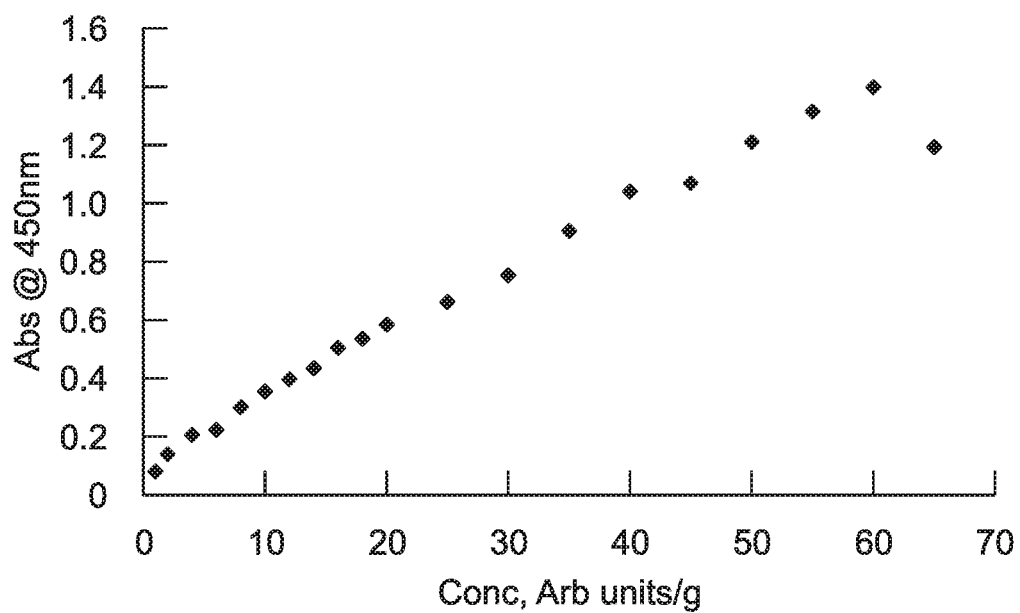
FIG. 2D is a plot of absorbance at 450 nm vs. concentration of green-emitting CFQD quantum dots in a film.

FIGS. 1A and 1B show absorption and emission spectra for green- and red-emitting CFQD quantum dots, respectively. Correspondingly, the emission from CFQD quantum dots has a reasonable chance of being re-absorbed by another dot in the vicinity of the emitting dot or in the escape path for the luminescence. The significance of this is that, as the loading is increased in order to absorb all of the blue light for color conversion, the re-absorption effects become larger and larger.

The consequences of re-absorption are to lower conversion efficiency or external quantum efficiency (EQE), to decrease the full-width at half-maximum (FWHM) and to red-shift the emission. The FWHM narrowing and photoluminescence (PL) red-shifting is due to more light on the short wavelength side of the emission peak being re-absorbed. FIGS. 2A-2D show how the EQE, peak wavelength and FWHM change with increasing % blue LED absorbance for green-emitting CFQD quantum dots (note: similar effects are seen for red CFQD quantum dots). In this case, the dots used had dilute-solution optical specifications of: PL=526.5 nm; FWHM=44 nm; PLQY=79%; and the film thickness was 300 microns. The data show that the change in EQE is small from 40% absorbance to 80%, after which it decreases as absorbance increases. Peak wavelength shows a more or less linear red-shift as absorbance increases whilst FWHM decreases initially then remains constant as absorbance increases.

Thus, there is a need for a QD architecture having improved absorption at 450 nm relative to the excitonic absorption.

Core/shell QDs with a thick shell, quantum dot-quantum well and dot-in-rod QD architectures are known in the art. However, specific compositions to facilitate their use as color-changing media for color filter applications have not been described.

Core/shell QDs with a shell of thickness ≥10 monolayers, so-called "giant" QDs, have been investigated as the thick shell is found to help desensitize the optical properties of the QD to environmental effects. Thick shells have been investigated for Cd-based QDs, in particular CdSe/CdS, but have not been reported for Cd-free systems.

InP/ZnSe/ZnS QDs have been reported in the prior art. However, the ZnSe shell thickness of ~1 monolayer would be insufficient to significantly improve the absorption profile of the QDs in the 450 nm region.

Quantum dot-quantum well (QD-QW) architectures are known in the art, however, to the best of Applicants' knowledge, the combination of a QD-QW structure and a thick second shell has not been previously described.

Figure 3:
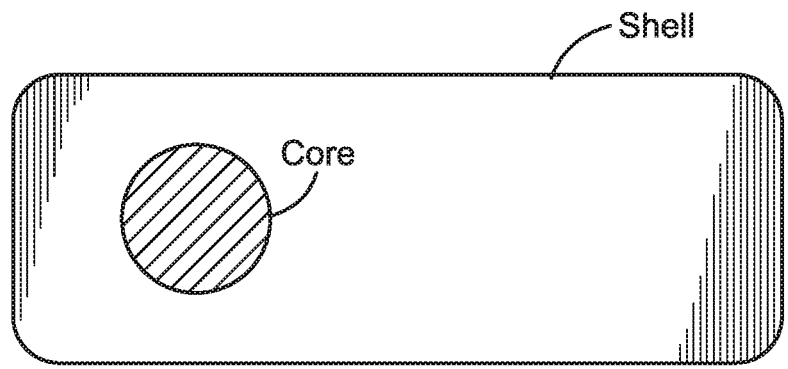
FIG. 3 is a cross-sectional, schematic depiction of a dot-in-rod-type architecture of the prior art.

A dot-in-rod-type architecture (FIG. 3) may minimize self-absorption. However, such a nanoparticle architecture in the art comprises an anisotropic core. The use of an alloyed core in such an architecture, to the best of the Applicant's knowledge, is not disclosed in the art.

Improved Absorption at 430-470 nm and Robustness

The durability of core-shell QDs depends to a large degree on the quality and thickness of the outer shell layers. The role of the shell layer is to isolate the core both electronically and physically from the external environment. Thick, energetically and crystallographically compatible shells can achieve this and, if sufficiently thick, can shield the core from ligand effects which are likely to be the first component of the quantum dot that is damaged when exposed to harsh environments such as incompatible solvents, high-heat, -light, -oxygen or -moisture environments.

As discussed above, CFQD quantum dots have a strong overlap between the first excitonic absorption and the emission which may result in negative effects on conversion efficiency and wavelength shifts when the dots are present in the very high concentrations needed for this application. If the absorbance of the materials in the range of 430-470 nm, in some instances in the range of 440-460 nm, and in some instances around 450 nm, can be increased significantly relative to the first excitonic absorption, this may allow for less re-absorption in the highly absorbing color filter system required. A way to achieve this is to grow a thick outer layer on the quantum dot consisting of a direct bandgap semiconductor that absorbs at about 450 nm. Photons that are absorbed in this layer can generate excitons which may fall into the core quantum well where they may recombine and emit light. In order to achieve such an architecture, the outer layer material needs to have the correct bandgap energy, conduction and valence band offsets relative to the core, and have a compatible lattice constant in order to grow epitaxially on the core without creating too much strain since lattice strain may ultimately lead to lowering of the photoluminescence quantum yield (PLQY) and stability of the dots.

In some embodiments, the core of a quantum dot comprises indium and phosphorus. For example, suitable materials include, but are not restricted to, InP and alloyed or doped derivatives thereof. In some instances, an alloyed quantum dot core comprising varying amounts of In, P, Zn and S can be used in accordance with various aspects of the present disclosure. In other instances, an alloyed quantum dot core comprising varying amounts of In, P, Zn and Se can be used in accordance with various aspects of the present disclosure. In yet other instances, an alloyed quantum dot core comprising varying amounts of In, P, Zn, S and Se can be used in accordance with various aspects of the present disclosure. In some instances, alloyed quantum dots cores can include varying amounts of one or more of Ga and Al in addition to, or in place of, In.

In some instances, alloyed quantum dot cores can be doped with up to 5 atomic % of one dopant or a combination of dopants. In some instances, a group I element such as Li, Na, and K can be used as a dopant. In some instances, a group II element such as Mg, Ca, and Sr can be used as a dopant. In some instances, a group III element such as B, Al or Ga. In some instances, a transition metal can be used as a dopant.

In some instances, QDs used in accordance with varying aspects of the present disclosure can include core material comprising:

IIA-VIB (2-16) material, consisting of a first element from group 2 of the periodic table and a second element from group 16 of the periodic table and also including ternary and quaternary materials and doped materials. Nanoparticle material includes but is not restricted to: MgS, MgSe, MgTe, CaS, CaSe, CaTe, SrS, SrSe, SrTe, BaS, BaSe, BaTe;

IIB-VIB (12-16) material consisting of a first element from group 12 of the periodic table and a second element from group 16 of the periodic table and also including ternary and quaternary materials and doped materials. Nanoparticle material includes but is not restricted to: ZnS, ZnSe, ZnTe, CdS, CdSe, CdTe, HgS, HgSe, HgTe;

II-V material consisting of a first element from group 12 of the periodic table and a second element from group 15 of the periodic table and also including ternary and quaternary materials and doped materials. Nanoparticle material includes but is not restricted to: $Zn_3P_2$, $Zn_3As_2$, $Cd_3P_2$, $Cd_3As_2$, $Cd_3N_2$, $Zn_3N_2$;

III-V material consisting of a first element from group 13 of the periodic table and a second element from group 15 of the periodic table and also including ternary and quaternary materials and doped materials. Nanoparticle material includes but is not restricted to: BP, AlP, AlAs, AlSb; GaN, GaP, GaAs, GaSb; InN, InP, InAs, InSb, AlN, BN;

III-IV material consisting of a first element from group 13 of the periodic table and a second element from group 16 of the periodic table and also including ternary and quaternary materials and doped materials. Nanoparticle material includes but is not restricted to: $B_4C$, $Al_4C_3$, $Ga_4C$;

III-VI material consisting of a first element from group 13 of the periodic table and a second element from group 16 of the periodic table and also including ternary and quaternary materials. Nanoparticle material includes but is not restricted to: $Al_2S_3$, $Al_2Se_3$, $Al_2Te_3$, $Ga_2S_3$, $Ga_2Se_3$, $In_2S_3$, $In_2Se_3$, $Ga_2Te_3$, $In_2Te_3$, InTe;

IV-VI material consisting of a first element from group 14 of the periodic table and a second element from group 16 of the periodic table, and also including ternary and quaternary materials and doped materials. Nanoparticle material includes but is not restricted to: GeTe, PbS, PbSe, PbTe, $Sb_2Te_3$, SnS, SnSe, SnTe; and nanoparticle material consisting of a first element from any group in the transition metal of the periodic table, and a second element from any group 16 of the periodic table and also including ternary and quaternary materials and doped materials. Nanoparticle material includes but is not restricted to: NiS, CrS, $CuInS_2$, $AgInS_2$.

By the term doped nanoparticle for the purposes of specifications and claims, refer to nanoparticles of the above and a dopant comprised of one or more main group or rare earth elements, this most often is a transition metal or rare earth element, such as but not limited to zinc sulfide with manganese, such as ZnS nanoparticles doped with $Mn^{2+}$.

The term "ternary material," for the purposes of specifications and claims, refers to QDs of the above but a three component material. The three components are usually compositions of elements from the as mentioned groups Example being $(Zn_xCd_{x-1}S)_mL_n$ nanocrystal (where L is a capping agent).

The term "quaternary material," for the purposes of specifications and claims, refer to nanoparticles of the above but a four-component material. The four components are usually compositions of elements from the as mentioned groups Example being $(Zn_xCd_{x-1}S_ySe_{y-1})_mL_n$ nanocrystal (where L is a capping agent).

The material used on any shell or subsequent numbers of shells grown onto the core particle in most cases will be of a similar lattice type material to the core material i.e. have close lattice match to the core material so that it can be epitaxially grown on to the core, but is not necessarily restricted to materials of this compatibility. The material used on any shell or subsequent numbers of shells grown on to the core present in most cases will have a wider bandgap then the core material but is not necessarily restricted to materials of this compatibility. In some instance, the materials of any shell or subsequent numbers of shells grown on to the core can include material comprising:

IIA-VIB (2-16) material, consisting of a first element from group 2 of the periodic table and a second element from group 16 of the periodic table and also including ternary and quaternary materials and doped materials. Nanoparticle material includes but is not restricted to: MgS, MgSe, MgTe, CaS, CaSe, CaTe, SrS, SrSe, SrTe, BaS, BaSe, BaTe;

IIB-VIB (12-16) material consisting of a first element from group 12 of the periodic table and a second element from group 16 of the periodic table and also including ternary and quaternary materials and doped materials. Nanoparticle material includes but is not restricted to: ZnS, ZnSe, ZnSeS, ZnTe, ZnO, CdS, CdSe, CdTe, CdO, HgS, HgSe, HgTe, HgO;

II-V material consisting of a first element from group 12 of the periodic table and a second element from group 15 of the periodic table and also including ternary and quaternary materials and doped materials. Nanoparticle material includes but is not restricted to: $Zn_3P_2$, $Zn_3As_2$, $Cd_3P_2$, $Cd_3As_2$, $Cd_3N_2$, $Zn_3N_2$;

III-V material consisting of a first element from group 13 of the periodic table and a second element from group 15 of the periodic table and also including ternary and quaternary materials and doped materials. Nanoparticle material includes but is not restricted to: BP, AlP, AlAs, AlSb; GaN, GaP, GaAs, GaSb; InN, InP, InAs, InSb, AlN, BN;

III-IV material consisting of a first element from group 13 of the periodic table and a second element from group 16 of the periodic table and also including ternary and quaternary materials and doped materials. Nanoparticle material includes but is not restricted to: $B_4C$, $Al_4C_3$, $Ga_4C$;

III-VI material consisting of a first element from group 13 of the periodic table and a second element from group 16 of the periodic table and also including ternary and quaternary materials. Nanoparticle material includes but is not restricted to: $Al_2S_3$, $Al_2Se_3$, $Al_2Te_3$, $Ga_2S_3$, $Ga_2Se_3$, $In_2S_3$, $In_2Se_3$, $Ga_2Te_3$, $In_2Te_3$, InTe;

IV-VI material consisting of a first element from group 14 of the periodic table and a second element from group 16 of the periodic table, and also including ternary and quaternary materials and doped materials. Nanoparticle material includes but is not restricted to: GeTe, PbS, PbSe, PbTe, $Sb_2Te_3$, SnS, SnSe, SnTe; and nanoparticle material consisting of a first element from any group in the transition metal of the periodic table, and a second element group 16 of the periodic table and also including ternary and quaternary materials and doped materials. Nanoparticle material includes but is not restricted to: NiS, CrS, $CuInS_2$, $AgInS_2$.

Based on its band gap and lattice constant, ZnSe is a suitable material that meets the criterion for a good shelling material discussed above. It is a direct bandgap semiconductor with a bandgap of approximately 2.8 eV at 25° C. This corresponds to an absorption onset at approximately 440 nm and thus relatively thick outer shell layers of ZnSe may increase the absorption profile of the dots in the wavelength region required. In some instances, a "thick" shell can be defined as a shell comprising more than one monolayer and less than or equal to twenty-two monolayers of material (1<number of monolayers ≤22). In some instances, it is preferred that a thick shell comprising three or more monolayers and 22 or less monolayers of material be used. In some instances, it is highly preferred that a thick shell comprising three or more monolayers and 15 or less monolayers of material be used. The lattice constants for InP and ZnSe are 5.87 Å and 5.67 Å, respectively. When grown epitaxially, the lattice strain is approximately 3.4% which may inhibit layers with greatly increased thickness. If the lattice strain is too high, a lattice buffer layer may be grown consisting of an InP—ZnSe alloy or even an $In_{0.6}Ga_{0.4}P$ alloy layer. In order to isolate the core and ZnSe layers electronically and physically, further wide-bandgap shell layers of ZnS and ZnO may be grown.

As an alternative to using thick ZnSe shells on simple core/shell quantum dots (with or without a lattice buffer layer), a quantum dot-quantum well structure may be used. In a quantum dot-quantum well structure, an emissive QD material layer such as a CFQD material layer or an InP material layer, may be grown around a ZnSe core and subsequently overcoated with a thick layer of ZnSe (1<number of monolayers ≤22, preferably 3≤number of monolayers ≤22, or more preferably 3≤number of monolayers ≤15). Although the lattice mismatch between the material types may still be an issue, it may be negated due to coherent strain between the $ZnSe_{core}$-$QD_{shell}$ and $QD_{shell}$-$ZnSe_{shell}$.

Figure 4:
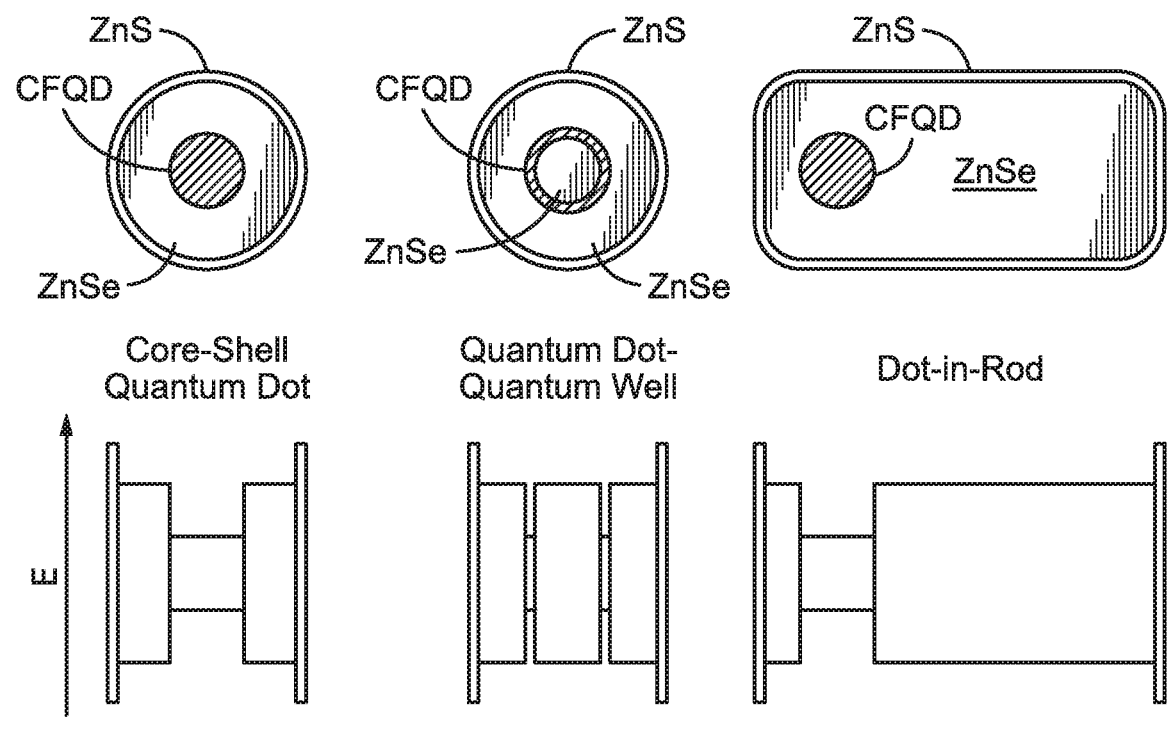
FIG. 4 is a schematic representation of three different nanoparticle architectures and their corresponding energy level alignments.

A dot-in-rod architecture may also provide the increased absorbance and robustness required. Here, the emissive QD core, such as a CFQD quantum dot or InP QD core is buried in a thick ZnSe shell (1<number of monolayers ≤15) that is elongated in one of an x, y, or z plane of the QD core to form a rod. The increased material in the elongated plane may lead to increased absorbance compared to a spherical dot. FIG. 4 is a schematic diagram illustrating a cross-sectional view of a spherical core-shell-shell (CFQD/ZnSe/ZnS) quantum dot architecture, a cross sectional view of a core-shell-shell-shell (ZnSe/CFQD/ZnSe/ZnS) quantum dot-quantum well architecture, and a cross-sectional view of a core-shell-shell (CFQD/ZnSe/ZnS) quantum dot-in-rod architecture and schematic representations of the energy level alignments of the different layers in each architecture.

FIG. 4 (not to scale) shows the relative alignment of the band gaps of the different layers in various nanoparticles according to the invention. In the core-shell-shell quantum dot, the CFQD quantum dot core is surrounded by a wider band gap material (ZnSe), which is surrounded by an even wider band gap material (ZnS). The relative band gap energies of the different layers are the same for the dot-in-rod structure. In the quantum dot-quantum well nanoparticle, the ZnSe core is surrounded by a narrower band gap CFQD quantum dot shell, which is surrounded by a wider band gap ZnSe shell (with the same band energy as the core), and a yet wider band gap ZnS shell.

For the core-shell-shell and dot-in-rod architectures, the relative positions of the band gaps, where the core band gap lies fully within the band gap of the shell, are typical of what is known as a "type 1 semiconductor heterostructure." Conversely, the quantum dot-quantum well architecture would be considered a "reverse type 1 semiconductor heterostructure."

Significant features illustrated in FIG. 4 are:
the relative magnitudes of the band gaps of the materials;
the relative energies (positions) of the band gaps of the materials in relation to each other.

Compatibility in Photo-Resists

The compatibility of a quantum dot, whether a core QD, core-shell QD, or core-multishell QD, with a resin, polymer or solvent is largely determined by the type of ligand(s) present on the surface of the quantum and the chemical interactions between said ligand and the particular resin, polymer or solvent. With current indium-based quantum dots, ligand exchange may be difficult because the shell may be relatively thin and influence of the ligand electronically on the core is dominant. This means that ligand exchange with current materials may be done during quantum dot synthesis in order to retain optimum performance. With the incorporation of thicker ZnSe shells, as described herein, the cores may be better isolated from ligand effects and more traditional ligand exchange strategies may become available.

Propyleneglycol monoethyl etheracetate (PGMEA) is a desirable solvent for color filter applications because of its good wettability, coatability, low toxicity and low boiling point. Currently available cadmium-free quantum dots are typically capped with thiolate and/or carboxylate ligands. 6-mercaptohexanol (MCH) and 2-[2-(2-methoxyethoxy)-ethoxy]-acetic acid (MEEAA) have been discovered to provide a particularly suitable ligand combination to impart solubility in PGMEA.

While MCH and MEEAA have been found to be particularly suitable, other ligands can be used in addition to or as an alternative of MCH and/or MEEAA. For example, in some instances, mercaptoalkyl alcohols or mercaptoalkoxy alcohols such as, for example 8-mercapto-1-octanol, 9-mercapto-1-nonanol, 11-mercapto-1-undecanol, 2-{2-[2-(2-mercaptoethoxy)ethoxy]ethoxy}ethanol, triethylene glycol mono-11-mercaptoundecyl ether, or (11-Mercaptoundecyl) tetra(ethylene glycol) can be used. In some instances, In some instances, a thiolated polyethylene glycol (PEG), such as O-(2-Mercaptoethyl)-O'-methyl-hexa(ethylene glycol), $H_3CO-(CH_2CH_2O)_x-CH_2CH_2SH$ (X=3-12), or $H_3C-(OCH_2CH_2)_x-SH$ (X=3-24) can be used. In some cases, a hydroxylated PEG such as $H_3C-(OCH_2CH_2)_x-OH$ (X=3-48) or octacosaethylene glycol can be used. In some instances, an amine-functionalised PEG such as $H_3C-(OCH_2CH_2)_x-OH$ (X=2-48) can be used. In some instances, a carboxylated PEG such as [2-(2-Methoxyethoxy)ethoxy] acetic acid, $H_3CO-(CH_2CH_2O)_x-CH_2COOH$ (X=8-10) or $H_3CO-(CH_2CH_2O)_x-CH_2CH_2SH$ (X=3-48) can be used.

QDs may be surface-functionalized with MCH and MEEAA according to the following general procedure:

First, QD cores are dissolved in a solvent to form a QD-solution. The QD-solution can have a QD concentration from about 1 milligram (mg) of QDs per milliliter (ml) of solvent (1 mg/mL) to about 500 mg/ml, alternatively from about 5 mg/ml to about 250 mg/ml, alternatively from about 10 mg/ml to about 100 mg/ml, and alternatively from about 25 mg/ml to about 75 mg/ml. To form a shell on the QD cores, one or more shell metal precursors are added to the QD-containing solution followed by MCH. The amount of shell metal precursors and MCH added to the QD-containing solution can be varied based upon the desired thickness of the shell to be formed on the QD cores. In some instances, an excess of one or more of the one or more shell metal precursors and the MCH can be added. In accordance with various aspects of the present disclosure, between about 0.5 ml and about 5 ml of MCH can be added to the QD-solution per gram of QDs within the QD-solution. In some instances, between about 1 ml and about 4 ml of MCH, alternatively between about 1.5 ml and about 3 ml, and alternatively between about 1.75 ml and about 2.75 ml of MCH can be added to the QD-solution per gram of QDs within the QD-solution. In some instances, all of the MCH can be added at one time. In some instances, the MCH can be added incrementally or continuously over a period of time ranging from about 10 minutes to about 6 hours, alternatively from about 15 minutes to about 5 hours, alternatively from about 30 minutes to about 4 hours, and alternatively from about 1 to about 3 hours.

After the MCH is added, the solution is heated to a first temperature for a first time period. The first temperature may be in the range 180 to 250° C. and the first time period between 10 minutes to 4 hours, for example, a first temperature of 230° C. for a first time period of approximately 1 hour. The MCH-functionalised overcoated QDs are isolated, for example by the addition of a non-solvent, follow by centrifugation.

After isolation, the MCH-functionalised overcoated QDs (MCH-QDs) are then redispersed in a second solvent and degassed under vacuum to form an MCH-QD-containing solution. The MCH-QD-containing solution can have a QD concentration from about 1 milligram (mg) of MCH-QDs per milliliter (ml) of solvent (1 mg/mL) to about 500 mg/ml, alternatively from about 5 mg/ml to about 250 mg/ml, alternatively from about 10 mg/ml to about 100 mg/ml, alternatively from about 15 mg/ml to about 50 mg/ml, and alternatively from about 20 mg/ml to about 40 mg/ml. MEEAA is added and the solution is heated to a second temperature for a second time period. In accordance with various aspects of the present disclosure, between about 0.5 ml and about 5 ml of MEEAA can be added to the MCH-QD-containing solution per gram of MCH-QDs within the MCH-QD-containing solution. In some instances, between about 1 ml and about 4 ml of MCH, alternatively between about 1.5 ml and about 3 ml, and alternatively between about 1.5 ml and about 2.5 ml of MEEAA can be added to the QD-solution per gram of MCH-QDs within the MCH-QD-containing solution. In some instances, an excess of the MEEAA can be added. In some instances, all of the MEEAA can be added at one time. In some instances, the MEEAA can be incrementally added over a period of ranging from about 10 seconds to about 10 minutes, alternatively from about 15 seconds to about 5 minutes, alternatively from about 30 seconds to about 3 minutes, and alternatively from about 30 seconds to about 2 minutes. The second temperature may be in the range 80 to 140° C. and the second time period between about 1 hour and about 24 hours, alternatively between about 2 hours and about 20 hours, and alternatively between about 4 hours and about 16 hours.

The resulting MCH- and MEEAA-functionalised overcoated QDs (MCH/MEEAA-QDs) are then isolated. In some instances, resulting MCH/MEEAA-QDs are isolated by the addition of a non-solvent followed by centrifugation. The resulting MCH/MEEAA-QDs have been found to be soluble in a wide range of solvents such as toluene, acetone, isopropanol and PGMEA. Interestingly, MCH/MEEAA-QDs formed in accordance with various aspects of the present disclosure were found to be insoluble in extremely non-polar solvents such as hexane as well as extremely polar solvents such as methanol.

The preparation of QD cores can be accomplished in any way known in the art. A discussed above, in accordance with various aspects of the present disclosure CFQD quantum dots can be used as the core. In some instances, methods for the preparation of QD cores, such as described in U.S. Pat. No. 7,588,828 to Mushtaq et al. entitled "Preparation of nanoparticle materials", which is hereby incorporated by reference in its entirety, can be used.

The choice of metal precursor(s) may depend on the semiconductor overcoating that is desired to be deposited on the QD cores. For example, if a ZnS overcoating is to be provided, the one or more metal precursors may comprise at least one zinc precursor. Suitable metal precursors include, but are not restricted to: carboxylates (for example, acetates, stearates, myristates, etc.); acetylacetonates; halides (for example, fluorides, chlorides, bromides, and iodides); nitrates; and metal alkyl precursors (for example, in the case of zinc precursors, dimethyl- or diethylzinc).

The first and second solvents may be the same or different. In some instances one or both of the first and second solvents are coordinating solvents. Coordinating solvents used in accordance with various aspects of the present disclosure include, but are not limited to, saturated or unsaturated $C_1$-$C_{24}$ alkyl or aryl alcohols, saturated or unsaturated $C_2$-$C_{24}$ alkyl or aryl amines, saturated or unsaturated $C_2$-$C_{24}$ alkyl or aryl thiols, saturated or unsaturated $C_2$-$C_{24}$ alkyl or aryl selenols, saturated or unsaturated $C_1$-$C_{24}$ alkyl or aryl carboxylic acids, phosphines, such as trioctylphosphine, or phosphine oxides, such as trioctylphosphine oxide. In some instances, one or both of the first and second solvents are non-coordinating solvents. Examples of suitable non-coordinating solvents include, but are not restricted to: linear or branched alkanes having 12 or more carbon atoms such as dodecane, pentadecane, octadecane, eicosane, triacontane, linear or branched alkenes (for example, 1-octadecene, 1-eicosene, 1-heptadecene), or a heat transfer fluid (for example, Therminol® 66 [SOLUTIA INC., 575 MARYVILLE CENTRE DRIVE, ST. LOUIS, MISSOURI 63141], a heat transfer fluid comprising a modified terphenyl). In general, it is preferable that a non-coordinating solvent, if used, have a boiling point of about 200° C. or higher under atmospheric conditions. In a preferred embodiment, the first and second solvents are non-coordinating solvents.

In an alternative embodiment, in order to achieve solubility in PGMEA, the inherent QD ligands may be exchanged for carboxylic acid- and thiol-functionalized polyethylene glycol (PEG) ligands, such as MCH and MEEAA. In some embodiments, ligand exchange strategies such as heating the as-formed QDs in a solution of the desired ligand(s) to be exchanged with ligands already disposed on the QD surface.

Liquid Crystal Displays with QD-Containing Color Filters

Figure 5:
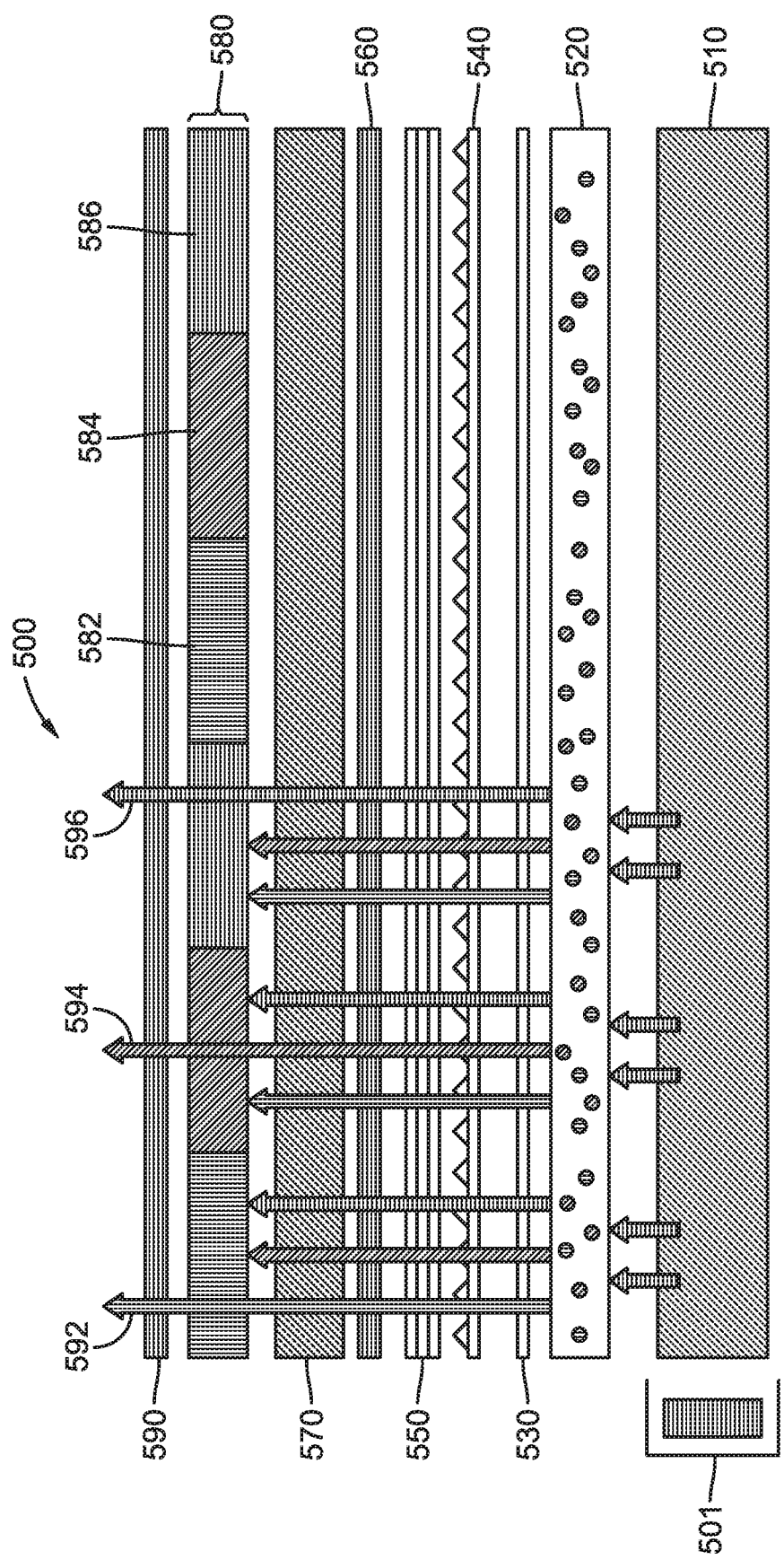
FIG. 5 is a schematic diagram of a liquid crystal display (LCD) with a QD-containing backlight unit of the prior art.

A liquid crystal display (LCD) 500 with a QD-containing backlight unit of the prior art is illustrated schematically in FIG. 5. The LCD 500 includes a blue light source 501, such as a blue light emitting diode, optically coupled with a light guide place (LGP) 510. Blue light is transmitted from the LGP 510 to a quantum dot-containing film (QDF) 520. The QDF 520 has two different types of QDs, one type capable of absorbing blue light from the LGP 510 and emitting red light, and another type capable of absorbing blue light from the LGP 510 and emitting green light. The QDF 520 is directly above the LGP 510 and converts some of the blue light from the light source 501 to green and red light which, when mixed with unconverted blue light from the light source 501, produces white light. The white light then travels from the QDF 520 and through, in order, a diffuser film 530, a brightness enhancing film (BEF) 540, a dual brightness enhancing film (DBEF) 550, a first reflective polarizer 560, and a liquid crystal layer (LCL) 570. After travelling through the LCL 570, the white light is selectively filtered into red, green and blue via red filters 582, green filters 584 and blue filters 586 of a color filter array (CFA) 580. The CFA 580 therefore selectively filters the white light to form individual RGB pixels. The red, green and blue light then travel through a second polarizer 590 for user visualization of red light 592, green light 594, and blue light 596.

As can be seen, one of the problems with such a system is that a significant fraction of the light is filtered out leading to system inefficiencies.

Figure 6:
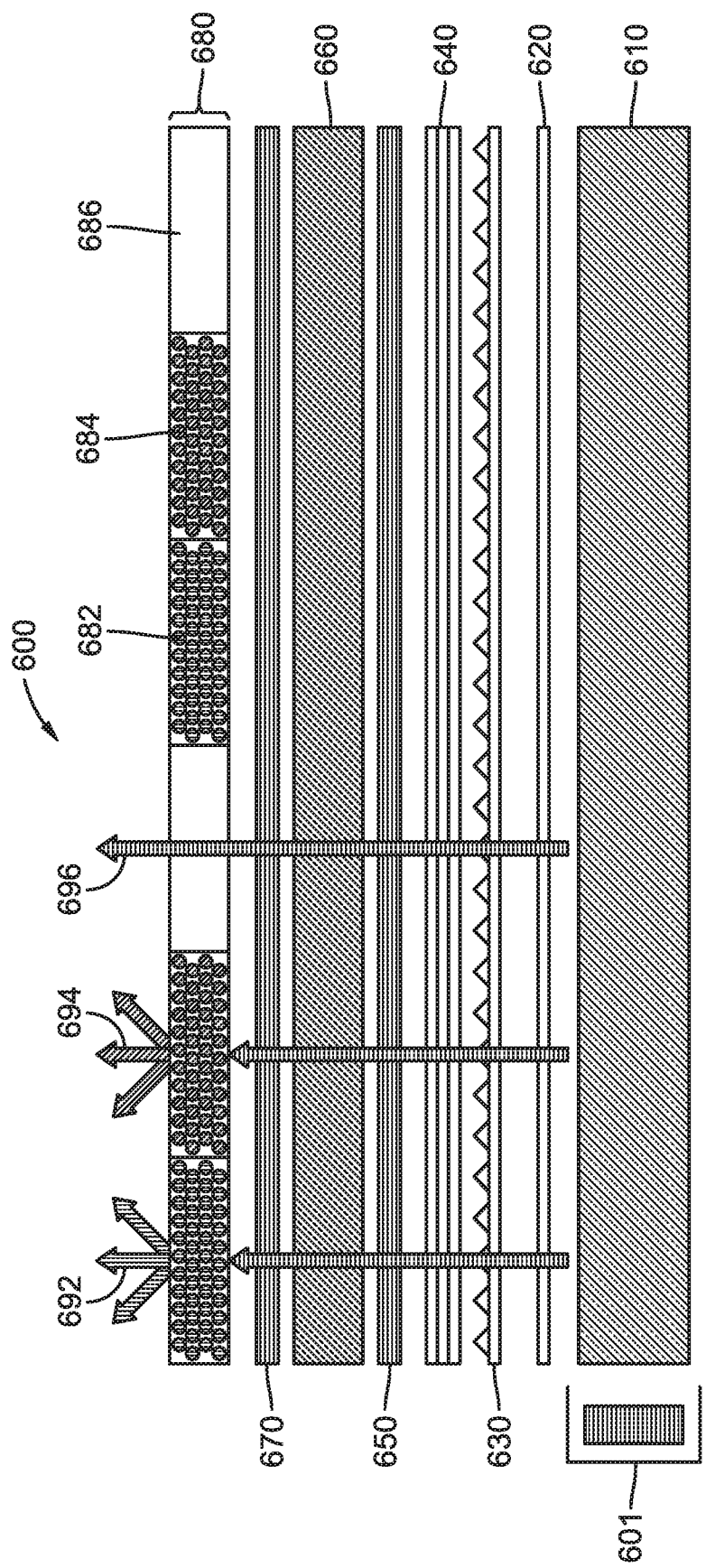
FIG. 6 is a schematic diagram of a liquid crystal display (LCD) having QDs directly in the color filters.

Rather than using a QD film, QDs may be directly incorporated into color filters of a color filter array of a LCD thereby providing a more efficient system and remedying the deficiencies of LCD displays such as LCD 500. One way of achieving this is illustrated in FIG. 6. FIG. 6 is a schematic diagram of a liquid crystal display (LCD) 600 having QDs directly in color filters of a color filter array. Unlike LCD 500, LCD 600 can achieve color purity by allowing a desired amount of blue light to be emitted from the LCD 600, and converting substantially 100% of the remaining blue light to red or green light. The LCD 600 includes a blue light source 601, such as a blue light emitting diode, optically coupled with a light guide place (LGP) 610. The blue light exits the LGP 610 and travels through, in order, a diffuser film 620, a brightness enhancing film (BEF) 630, a dual brightness enhancing film (DBEF) 640, a first reflective polarizer 650, and a liquid crystal layer (LCL) 660 and a second reflective polarizer 670.

Upon exiting the second polarizer 670, a portion of the blue light is absorbed by a red color-conversion filter 682 of a color filter array (CFA) 680, another portion of blue light is absorbed by a green color-conversion filter 684 of the CFA 680, and another portion of the blue light travels through a region 686 of the CFA 680 which does not contain a color-conversion filter. The red color-conversion filter 682 comprises a population of a first type quantum dots dispersed in a suitable matrix material. The first type of quantum dots can be any quantum dots which are capable of absorbing blue light and emitting red light 692. The green color-conversion filter 684 comprises a population of a second type quantum dots dispersed in a suitable matrix material. The second type of quantum dots can be any quantum dots which are capable of absorbing blue light and emitting green light 694. The region 686 is made of a suitable matrix material which does not alter the blue light.

The matrix material of red color-conversion filter 682, green color-conversion filter 684 and region 686 can be any suitable photocurable polymer or resin. In accordance with various aspects of the present disclosure, a photocurable polymer or resin which allows for at least about 70% transmission of red, green and blue (RGB) light therethrough can be chosen. In other instances, a photocurable polymer or resin which allows for at least about 80% transmission of RGB light therethrough, at least about 90% transmission of RGB light therethrough, at least about 95% transmission of RGB light therethrough, and at least about 99% transmission of RGB light therethrough is chosen.

In accordance with various aspects of the present disclosure, the color-conversion filters 682, 684 and region 686 can have thicknesses ranging from about 5 μm to about 100 μm, alternatively from about 5 μm to about 75 μm, alternatively from about 5 μm to about 50 μm, alternatively from about 10 μm to about 40 μm, and alternatively from about 15 μm to about 30 μm. Also in accordance with various aspects of the present disclosure, the color-conversion filters 682, 684 can be made of about 5 to about 80 wt % quantum dots, alternatively from about 5 to about 70 wt % quantum dots, alternatively from about 10 to about 70 wt % quantum dots, alternatively from about 10 to about 60 wt % quantum dots, and alternatively from about 10 to about 50 wt % quantum dots. In general, as the thickness of the filters 682,684 are increased the amount of quantum dots dispersed therein may be lowered. For example, in accordance with various aspect of the present disclosure, filters 682,684 having a thickness of about 15 μm can be made of about 40 to about 60 wt %, and alternatively about 50 wt %, quantum dots. Also for example, in accordance with various aspect of the present disclosure, filters 682,684 having a thickness of about 30 μm can be made of about 20 to about 30 wt %, and alternatively about 25 wt %, quantum dots. In some instances, on ore more of color-conversion filters 682, 684 and region 686 can further include suitable amounts of a light scattering agent such as particles of barium sulfate, titania, silica, or other similar materials.

Examples

To determine the suitability of MCH and MEEAA cap quantum dots for use in PGMEA, a green emitting quantum dot capped with MCH and MEEAA was produced in a method in accordance with the method described above (Example 1). For comparison, four other green- or red-emitting quantum dots were also synthesized and capped with polyethylene glycol, or PEG (Mw=350, Examples 2-5), which is also known to have good compatibility with PGMEA. The quantum yields (QY) of each type of capped QD are reported in Table 1. As can be seen, the green emitting quantum dot capped with MCH and MEEAA maintains a high QY of 87% when in PGMEA. The quantum dots coated with PEG, on the other hand, exhibited QYs ranging from only 32-63%, indicating the PEG-capped QDs suffered from substantial quenching when placed in PGMEA.

TABLE 1

| Ex. | Quantum Dot | Capping ligand(s) | $PL_{max}$ (nm) | FWHM (nm) | QY (%) |
|---|---|---|---|---|---|
| 1 | CFQD core/multishell | MCH/ MEEAA | 529.5 | 38.8 | 87 @ 450 nm excitation |
| 2 | CFQD core/multishell | PEG | 547 | — | 47 @ 480 nm excitation 54 @ 400 nm excitation |
| 3 | CFQD core/shell | PEG | 541 | — | 58 @ 480 nm excitation 63 @ 400 nm excitation |
| 4 | CFQD core/multishell | PEG | 542 | — | 29 @ 480 nm excitation 32 @ 400 nm excitation |
| 5 | CFQD core/shell | PEG | 592 | — | 44 @ 480 nm excitation |

Statements of the Disclosure

Statements of the Disclosure include:

Statement 1: A quantum dot comprising a core; a layer substantially surrounding the core; and 6-mercaptohexanol (MCH) and 2-[2-(2-methoxyethoxy)-ethoxy]-acetic acid (MEEAA) capping ligands.

Statement 2: A quantum dot according to Statement 1, wherein the layer consists essentially of a direct bandgap semiconductor that absorbs light having a wavelength between about 430 nm and about 470 nm.

Statement 3: A quantum dot according to Statement 1 or 2, wherein the layer consists essentially of a direct bandgap semiconductor that absorbs light having a wavelength of about 450 nm.

Statement 4: A quantum dot according to any one of Statements 1-3, wherein the core comprises indium and phosphorus.

Statement 5: A quantum dot according to any one of Statements 1-4, wherein the core comprises alloyed or doped derivatives of InP.

Statement 6: A quantum dot according to any one of Statements 1-5, wherein the core comprises InPZnS.

Statement 7: A quantum dot according to any one of Statements 1-5, wherein the core comprises InPZnSe.

Statement 8: A quantum dot according to any one of Statements 1-5, wherein the core comprises InPZnSeS.

Statement 9: A quantum dot according to any one of Statements 1-8, wherein the layer comprises a metal chalcogenide.

Statement 10: A quantum dot according to Statement 9, wherein the metal chalcogenide is any one of ZnS, ZnSe, ZnSeS and ZnO.

Statement 11: A quantum dot according to any one of Statements 1-10, wherein the layer substantially surrounding the core comprises greater than one monolayer and less than or equal to twenty-two monolayers.

Statement 12: A quantum dot according to any one of Statements 1-11, wherein the layer substantially surrounding the core comprises three or more monolayers and less than or equal to twenty-two monolayers.

Statement 13: A quantum dot according to any one of Statements 1-12, wherein the layer substantially surrounding the core comprises three or more monolayers and less than or equal to twenty-two monolayers.

Statement 14: A quantum dot according to any one of Statements 1-13, wherein the layer substantially surrounding the core comprises three or more monolayers and less than or equal to fifteen monolayers.

Statement 15: A composition comprising a plurality of quantum dots according to any one of Statements 1-14 dispersed in propyleneglycol monoethyl etheracetate (PGMEA).

Statement 16: A quantum dot comprising a core comprising indium and having a first band gap; a first layer substantially surrounding the core and comprising a first metal chalcogenide having a second band gap that is greater than the first band gap; and a second layer on the first layer comprising a second metal chalcogenide having a third band gap that is greater than the second band gap, wherein the first layer comprises more than one monolayer and less than or equal to twenty-two monolayers of the first metal chalcogenide.

Statement 17: A quantum dot comprising a core comprising indium and having a first band gap; a first layer substantially surrounding the core and comprising a first metal chalcogenide having a second band gap that is greater than the first band gap; and a second layer on the first layer comprising a second metal chalcogenide having a third band gap that is greater than the second band gap, wherein the first layer comprises three or more monolayers and less than or equal to twenty-two monolayers of the first metal chalcogenide.

Statement 18: A quantum dot comprising a core comprising indium and having a first band gap; a first layer substantially surrounding the core and comprising a first metal chalcogenide having a second band gap that is greater than the first band gap; and a second layer on the first layer comprising a second metal chalcogenide having a third band gap that is greater than the second band gap, wherein the first layer comprises three or more monolayers and less than or equal to fifteen monolayers of the first metal chalcogenide.

Statement 19: A quantum dot according to any one of Statements 16-18, wherein the quantum dot has a dot-in-rod architecture.

Statement 20: A quantum dot according to Statement 19, wherein the core is displaced longitudinally from the center of the rod.

Statement 21: A quantum dot according to any one of Statements 16-20, wherein the core comprises indium and phosphorus.

Statement 22: A quantum dot according to any one of Statements 16-21, wherein the core comprises alloyed or doped derivatives of InP.

Statement 23: A quantum dot according to any one of Statements 16-22, wherein the core comprises InPZnS.

Statement 24: A quantum dot according to any one of Statements 16-22, wherein the core comprises InPZnSe.

Statement 25: A quantum dot according to any one of Statements 16-22, wherein the core comprises InPZnSeS.

Statement 26: A quantum dot according to any one of Statements 16-25, wherein the layer comprises a metal chalcogenide.

Statement 27: A quantum dot according to Statement 26, wherein the metal chalcogenide is any one of ZnS, ZnSe, ZnSeS and ZnO.

Statement 28: A composition comprising a plurality of quantum dots according to any one of Statements 16-27 dispersed in propyleneglycol monoethyl etheracetate (PG-MEA).

Statement 29: A quantum dot-quantum well semiconductor nanoparticle comprising a core comprising a first metal chalcogenide having a first band gap; a first layer substantially surrounding the core and comprising indium and having a second band gap that is less than the first band gap; a second layer substantially surrounding the first layer and comprising a second metal chalcogenide and having a third band gap substantially equal to the first band gap; a third layer substantially surrounding the second layer and comprising a third metal chalcogenide having a third band gap that is greater than the first band gap and the second band gap, wherein the second layer comprises more than one monolayer and less than or equal to twenty-two monolayers of the first metal chalcogenide.

Statement 30: A quantum dot-quantum well semiconductor nanoparticle comprising a core comprising a first metal chalcogenide having a first band gap; a first layer substantially surrounding the core and comprising indium and having a second band gap that is less than the first band gap; a second layer substantially surrounding the first layer and comprising a second metal chalcogenide and having a third band gap substantially equal to the first band gap; a third layer substantially surrounding the second layer and comprising a third metal chalcogenide having a third band gap that is greater than the first band gap and the second band gap, wherein the second layer comprises three or more and less than or equal to twenty-two monolayers of the first metal chalcogenide.

Statement 31: A quantum dot-quantum well semiconductor nanoparticle comprising a core comprising a first metal chalcogenide having a first band gap; a first layer substantially surrounding the core and comprising indium and having a second band gap that is less than the first band gap; a second layer substantially surrounding the first layer and comprising a second metal chalcogenide and having a third band gap substantially equal to the first band gap; a third layer substantially surrounding the second layer and comprising a third metal chalcogenide having a third band gap that is greater than the first band gap and the second band gap, wherein the second layer comprises three or more and less than or equal to fifteen monolayers of the first metal chalcogenide.

Statement 32: A quantum dot-quantum well semiconductor nanoparticle according to any one of Statements 29-31, wherein the first metal chalcogenide and the second metal chalcogenide are different metal chalcogenides.

Statement 33: A quantum dot-quantum well semiconductor nanoparticle according to any one of Statements 29-31, wherein the first metal chalcogenide and the third metal chalcogenide are the same metal chalcogenide.

Statement 34: A quantum dot-quantum well semiconductor nanoparticle according to any one of Statements 29-33, wherein each of the first, second and third metal chalcogenides the metal chalcogenide is any one of ZnS, ZnSe, ZnSeS and ZnO.

Statement 35: A quantum dot-quantum well semiconductor nanoparticle according to any one of Statements 29-34, wherein the first layer comprises indium and phosphorus.

Statement 36: A quantum dot-quantum well semiconductor nanoparticle according to any one of Statements 29-35, wherein the first layer comprises alloyed or doped derivatives of InP.

Statement 37: A quantum dot-quantum well semiconductor nanoparticle according to any one of Statements 29-36, wherein the first layer comprises InPZnS.

Statement 38: A quantum dot-quantum well semiconductor nanoparticle according to any one of Statements 29-36, wherein the first layer comprises InPZnSe.

Statement 39: A quantum dot-quantum well semiconductor nanoparticle according to any one of Statements 29-36, wherein the first layer comprises InPZnSeS.

Statement 40: A composition comprising a plurality of quantum dots according to any one of Statements 29-39 dispersed in propyleneglycol monoethyl etheracetate (PG-MEA).

Statement 40: A liquid crystal display (LCD) comprising a source of light in the blue portion of the visible spectrum; and a color filter array in optical communication with the source of blue light and containing a plurality of quantum dots according any one of Statements 1-14, 16-27 and 29-39.

Statement 41: A liquid crystal display (LCD) comprising a source of light in the blue portion of the visible spectrum; and a color filter array in optical communication with the source of blue light and containing a plurality of quantum dots according any one of Statements 1-14, 16-27 and 29-39, wherein the color filter is formed from a composition according to any one of Statements 15, 28 and 40.

The foregoing presents particular embodiments of a system embodying the principles of the invention. Those skilled in the art will be able to devise alternatives and variations which, even if not explicitly disclosed herein, embody those principles and are thus within the scope of the invention. Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. A quantum dot comprising:
    a core comprising InPZnS, InPZnSe or InPZnSeS;
    a layer substantially surrounding the core; and
    6-mercaptohexanol (MCH) and 2-[2-(2-methoxyethoxy)-ethoxy]-acetic acid (MEEAA) capping ligands.

2. The quantum dot of claim 1, wherein the layer consists essentially of a direct band gap semiconductor that absorbs light having a wavelength between about 430 nm and about 470 nm.

3. The quantum dot of claim 1, wherein the layer comprises a metal chalcogenide.

4. The quantum dot of claim 3, wherein the metal chalcogenide is any one of ZnS, ZnSe, ZnSeS and ZnO.

5. The quantum dot of claim 1, wherein the layer substantially surrounding the core comprises three or more monolayers and less than or equal to 22 monolayers.

6. The quantum dot of claim 1, wherein the layer substantially surrounding the core comprises three or more monolayers and less than or equal to 15 monolayers.

7. A composition comprising a plurality of quantum dots according to claim 1 dispersed in polyethylene glycol monoethyl ethacrylate (PGMEA).

8. A liquid crystal display comprising:
   a source of light in the blue portion of the visible spectrum; and
   a colour filter array in optical communication with the source of blue light and containing a plurality of quantum dots, each quantum dot comprising:
      a core;
      a layer substantially surrounding the core; and
      6-mercaptohexanol (MCH) and 2-[2-(2-methoxy-ethoxy)-ethoxy]-acetic acid (MEEAA) capping ligands.

9. The liquid crystal display of claim 8, wherein the layer substantially surrounding the core consists essentially of a direct band gap semiconductor that absorbs light having a wavelength between about 430 nm and about 470 nm.

10. The liquid crystal display of claim 8, wherein the core comprises indium and phosphorus.

11. The liquid crystal display of claim 8, wherein the core comprises an alloyed or doped derivative of InP.

12. The liquid crystal display of claim 8, wherein the core comprises InPZnS.

13. The liquid crystal display of claim 8, wherein the core comprises InPZnSeS.

14. The liquid crystal display of claim 8, wherein the layer substantially surrounding the core comprises a metal chalcogenide.

15. The liquid crystal display of claim 14, wherein the metal chalcogenide is any one of ZnS, ZnSe, ZnSeS and ZnO.

16. The liquid crystal display of claim 8, wherein the layer substantially surrounding the core of the quantum dots comprises three or more monolayers and less than or equal to 22 monolayers.

17. The liquid crystal display of claim 8, wherein the layer substantially surrounding the core comprises three or more monolayers and less than or equal to 15 monolayers.

18. The liquid crystal display of claim 8, wherein the colour filter array comprises a matrix.

19. The liquid crystal display of claim 18, wherein the matrix comprises a photocurable resin or polymer.

20. The liquid crystal display of claim 8, wherein the colour filter array further comprises a light scattering agent.

* * * * *